United States Patent [19]

Arbanas

[11] Patent Number: 5,388,028
[45] Date of Patent: Feb. 7, 1995

[54] LOW IMPEDANCE INTERCONNECTION ASSEMBLY FOR HIGH FREQUENCY SWITCHING POWER SEMICONDUCTOR DEVICES AND LOW INDUCTANCE MODULAR CAPACITOR

[75] Inventor: Zeljko Arbanas, Marlboro, Mass.

[73] Assignee: Kaman Electromagnetics Corporation, Hudson, Mass.

[21] Appl. No.: 200,288

[22] Filed: Feb. 22, 1994

Related U.S. Application Data

[63] Continuation-in-part of Ser. No. 98,739, Jul. 28, 1993, Pat. No. 5,313,363.

[51] Int. Cl.6 .............................................. H05H 7/20
[52] U.S. Cl. .................... 361/710; 361/734; 361/775; 361/502
[58] Field of Search ....... 174/16.3; 361/704, 707–711, 361/734, 763, 775, 780, 783, 811, 513–520, 526, 535–541

[56] References Cited

U.S. PATENT DOCUMENTS

| | | | |
|---|---|---|---|
| 4,755,910 | 7/1988 | Val | 361/763 |
| 4,965,123 | 2/1990 | Windle et al. | 361/775 |
| 5,053,920 | 10/1991 | Staffiere et al. | 361/775 |
| 5,227,960 | 7/1993 | Kunishi et al. | 361/502 |
| 5,303,118 | 4/1994 | Saito et al. | 361/502 |

FOREIGN PATENT DOCUMENTS 0087511  3/1990  Japan ................................ 361/502

Primary Examiner—Gregory D. Thompson
Attorney, Agent, or Firm—McCormick, Paulding & Huber

[57] ABSTRACT

A low impedance interconnection assembly for use with high frequency switching power semiconductor devices includes a low inductance modular capacitor, multi-layer planar bus structure and semiconductor switching devices assembled as a laminated unitary structure. Terminals electrically and physically connect the positive electrode of the modular capacitor to the positive DC voltage potential carried by the bus structure and the positive DC input of the semiconductor switch and other terminals electrically and mechanically couple the negative electrode of the modular capacitor to the negative DC voltage potential layer of the bus structure and the negative DC input of the switching device. The low inductance modular capacitor is made of a number of capacitor elements having their respective positive electrodes bonded to a copper foil pattern strip to define a positive electrode and their respective negative electrode terminals to a second copper foil strip to define the negative electrode. All capacitors share in supplying high slew rate current to the semiconductor switching devices to reduce losses in the capacitor.

11 Claims, 3 Drawing Sheets

LOW IMPEDANCE INTERCONNECTION ASSEMBLY FOR HIGH FREQUENCY SWITCHING POWER SEMICONDUCTOR DEVICES AND LOW INDUCTANCE MODULAR CAPACITOR

This is a continuation-in-part of co-pending application Ser. No. 08/098,739 filed on Jul. 28, 1993 U.S. Pat. No. 5,313,363.

BACKGROUND OF THE INVENTION

The present invention relates generally to assemblies for the interconnection of high frequency switching power semiconductor devices and deals more specifically with an assembly for providing low impedance interconnection between high frequency switching power semiconductor devices and a low inductance modular capacitor to minimize the development of high voltage transient spikes across the semiconductor devices during rapid turn-on/turn-off switching. The present invention also relates to a low inductance modular capacitor for use with the interconnection assembly.

High power switching applications such as those found in high power multi-phase DC-to-AC converters which generate multi-phase AC voltages for powering multi-phase motors and the like are generally limited in performance due to limitation in switching high DC currents at high frequencies to produce a desired AC voltage signal output with a desired magnitude and harmonic content. Often, the switching power semiconductor devices are subjected to voltage transient spikes during switching which, without suppression, destroy the semiconductor device. There are a number of known techniques for reducing the development of high voltage transient spikes on high frequency switching power semiconductor devices during rapid turn-on/turn-off switching. Typically, two different types of capacitors are utilized in such switching circuits to reduce the switching frequency voltage. A relatively large storage capacitor is coupled to the voltage distribution bus which supplies power to the semiconductor switching devices. This large storage capacitor functions to provide low frequency current filtering. Smaller, fast switching capacitors are located in as close proximity as possible to the semiconductor switching devices and function to filter high amplitude transient currents which occur during the switching process. The smaller faster switching capacitors are characterized by high current handling capacity and typically are either coupled directly to the DC voltage power bus or form a part of various snubber circuits which are coupled to the semiconductor switching devices and which snubber circuits and techniques are well known to those skilled in the art. The construction and assembly of these typical circuits are time consuming, labor intensive and generally employ point-to-point wiring and high inductance capacitors which tends to present higher than desired impedances at the frequencies of interest.

It is desirable therefore to reduce the time and effort required to assemble and interconnect high frequency switching power semiconductor devices and current filtering and voltage transient suppression devices.

It is a general aim of the present invention therefore to provide a packaging assembly which facilitates a low impedance interconnection between high frequency switching power semiconductor devices and low inductance capacitors and a DC voltage potential applied to and switched by the semiconductor devices.

It is a further aim of the present invention to provide a low inductance modular capacitor for use with the assembly of the present invention.

It is a yet further aim of the present invention to provide a low impedance interconnection assembly that is not susceptible to damage due to mechanical shock and vibration.

SUMMARY OF THE INVENTION

In accordance with the present invention, a low impedance interconnection assembly for use with high frequency switching power semiconductor devices includes a heat sink mounting plate upon which a plurality of high frequency switching powers semiconductor devices are mounted. A multi-layer planar bus structure is in facing relationship with the semiconductor devices and carries positive and negative DC voltage potentials. At least one low inductance modular capacitor is in facing contact with the upper surface of the multi-layer bus structure and includes at least one positive polarity electrode connection means and at least one negative polarity electrode connection means. At least one first electrical coupling means couples the positive polarity electrode of the modular capacitor to the positive DC voltage potential of the bus structure and the positive DC voltage input of the semiconductor device. At least one second electrical coupling means couples the negative polarity electrode of the modular capacitor to the negative DC voltage potential of the bus structure and the negative DC voltage input of the semiconductor device. The first and second electrical coupling means also function to mechanically hold the modular capacitor, multi-layer bus structure and semiconductor switching devices in a laminated unitary structure.

The invention further resides in the low inductance modular capacitor being made of a plurality of standard film/foil wound enclosureless capacitor elements or alternatively multi-layer ceramic capacitor elements, packaged side-by-side and edge-to-edge. A jacket of metallic foil conductive material encloses the periphery and is bent over the top of the capacitor element with the positive polarity electrode terminals or tabs of each of the capacitor elements being electrically connected to a conductive foil "I"-shaped pattern strip which provides a large current carrying surface along the web of the "I". Positive polarity connection bushings are bonded by wire to the metallic foil jackets of adjacent capacitor elements. The negative polarity electrode terminals or tabs of each of the capacitor elements being electrically connected to a second conductive foil "I"-shaped pattern strip which provides a large current carrying surface area along the web of the "I". Negative polarity connection bushings are electrically wired to the negative polarity conductive foil "I"-shaped pattern strip. The conductive foil "I"-shaped pattern strips provide a low inductance in the region of the capacitor element electrode terminations for handling the high slew rate currents developed during the switching of the power semiconductor. The capacitor elements making up the low inductance modulator capacitor exhibit a higher inductance towards the center region which results in the center region carrying low frequency switching currents.

BRIEF DESCRIPTION OF THE DRAWINGS

Other features and advantages of the present invention will become readily apparent from the following written description and drawings wherein.

WRITTEN DESCRIPTION OF PREFERRED EMBODIMENTS

Figure 1:
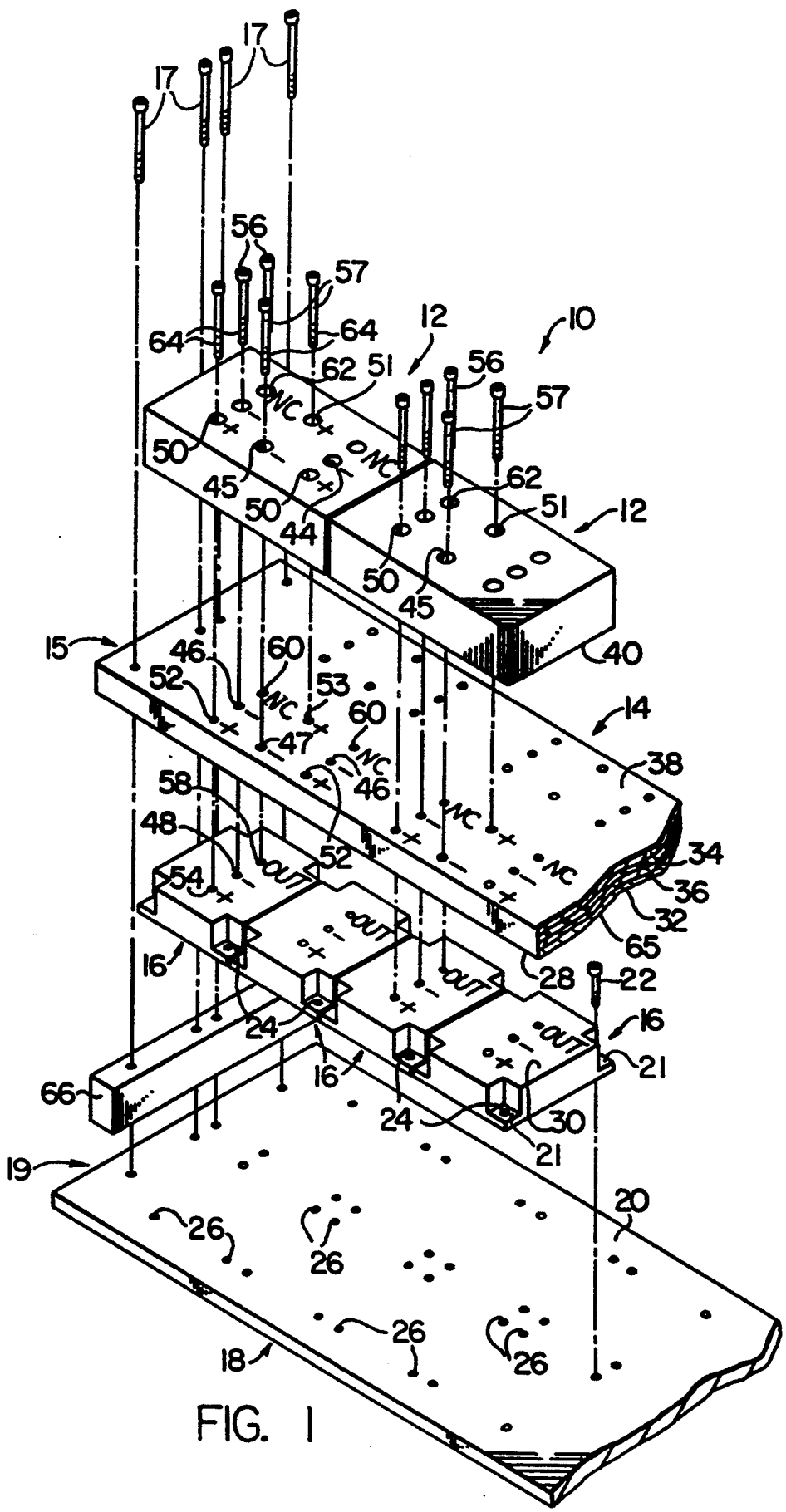
FIG. 1 is an exploded view of one embodiment of the low impedance interconnection assembly of the present invention for high frequency switching power semiconductor devices showing the low inductance modular capacitor, multi-layer planar DC voltage bus structure, power semiconductor devices and heat sink mounting plate.

Turning now to the drawings and considering FIG. 1, the low impedance interconnection assembly comprising the present invention is schematically illustrated therein as an exploded view and is generally designated 10 and as shown represent two phases or poles of a multi-pole DC-to-AC converter and the like. The component parts, when fully assembled, are disposed one above the other and provide a laminated or sandwiched unitary structure. The component parts of the interconnection assembly 10 comprise a low inductance modular capacitor generally designated 12, a multi-layer planar voltage distribution bus structure 14, high frequency switching power semiconductor devices 16,16 and a heat sink or mounting plate 18. The heat sink or mounting plate 18 has a surface 20 upon which the switching power semiconductor device packages 16,16 are mounted and held thereto by attachment means, such as, for example, socket head cap screws 22,22 or other suitable attaching means known in the art. Mounting holes 24,24 pass through the semiconductor device packages 16,16 to receive the screws 22,22 and in the illustrated embodiment are shown passing through shoulder portions 21,21 in the respective corners of the semiconductor device packages. The heat sink 18 has a number of pre-spaced and positioned holes 26,26 in the surface 20 and which holes are in registration with the respective holes 24,24 of the semiconductor device packages when the devices are located and mounted on the heat sink. The holes 26,26 are tapped to accept the screw thread of the respective screws 22,22 to securely hold the semiconductor device package 16 to the heat sink 18 when the screws are screwed in. As so assembled, the heat sink 18 absorbs and dissipates heat produced by the semiconductor power switching devices packages 16,16. It will be recognized by those skilled in the art that the power semiconductor device packages may be in a number of different package configurations each having different respective attachment patterns and means for connection to the heat sink. Likewise, it will be recognized that the heat sink may be of different types, for example, fluid cooled.

A low inductance laminated or multi-layer planar bus structure 14 is used to provide DC voltage distribution to the switching power semiconductor devices with each respective voltage carrying layer carrying a predetermined voltage potential. The bus structure 14 has a substantially flat outwardly facing lower surface 28 which comes into contact with the upper surface 30 of the semiconductor power switching device packages 16,16 when the components are assembled. The bus structure 14 may have a number of voltage potential carrying and ground reference potential layers, each layer being separated physically and electrically insulated by a dielectric layer 36. In the illustrated embodiment, layer 32 carries a DC voltage potential of a first polarity, layer 34 carries a DC voltage of an opposite polarity and a dielectric layer 36 is sandwiched between layers 32 and 34 to provide electrical insulation between the two DC voltage potential layers. Although not shown in the figures, a dielectric layer may be placed between the low inductance modular capacitor and the upper surface 38 of the bus structure 14 or alternately the dielectric layer may be made part of the bus structure. The construction and operation of multi-layer planar bus structures are generally known. The multi-layer planar bus structure 14, in addition to being connected to the low inductance modular capacitor 12 and the high frequency switching power semiconductor device packages 16,16, is mounted to the surface of the heat sink 18 through a mechanical support structure 66. The support structure 66 is preferably made of a thermally conductive material and located along the marginal edge 19 of the heat sink and the marginal shoulder region 15 along the end region of the bus structure 14 and disposed therebetween. The marginal shoulder region is defined by the area of the bus structure left exposed when the modular capacitor and semiconductor devices are attached to the bus structure. The height of the support structure 66 is substantially the same as the height of the semiconductor packages 16,16 so that the bus structure 14 is supported at both ends and by the semiconductor packages in the same plane and which bus structure plane is parallel to the plane of the surface of the heat sink. Screws 17,17 pass through holes located along the marginal shoulder region 15 in the bus structure, through holes in the support structure 66 and threaded into tapped holes in the heat sink with the respective holes in the bus structure, support structure and heat sink being in registry. Alternatively, the semiconductor packages and the modular capacitors can be spaced to accommodate additional support structures. These additional support structures, if employed, are preferably made of thermally conductive material and are deployed to provide heat conduction in addition to mechanical support in a similar manner as support structure 66.

Figure 2:
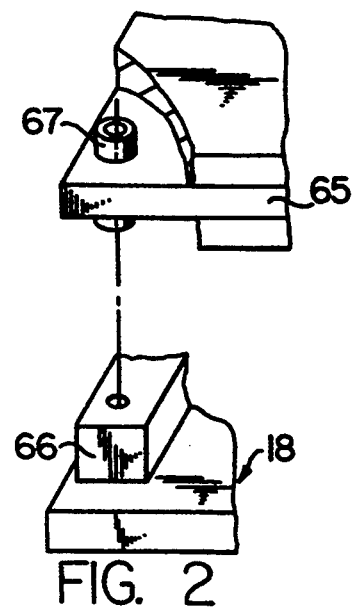
FIG. 2 is a partial exploded view of the heat sink mounting plate, thermal spacer and partial cut-away view of the multi-layer bus structure showing a thermally conductive bushing used in the bus structure and through which a socket head cap screw is threaded to mechanically connect the bus to the heat sink used with the assembly of the invention.

Optionally, one or more electrically isolated parallel thermal plane(s) 65 can be located adjacent to one or more of the DC voltage potential carrying layers. The thermal plane(s) 65 is made of a thermally conductive material and is used to conduct heat out of the voltage potential carrying layers and/or the attached components. FIG. 2 shows an exploded detail of one bushing 67 wherein a corner of the interconnection assembly 10 is shown cut away at all levels except the level of the thermal plane 65 to more clearly illustrate the bushing. In the illustrated embodiment, heat would be conducted along the thermal plane to bushings 67 distributed along the thermal plane. The bushings 67 are also made of thermally conductive material, and are attached to the thermal plane 65 by thermally conductive joints, for example, by brazing. The bushings 67 serve to carry heat from the thermal plane 65 to the mechanical support structures 66,66 which in turn carry heat to the heat sink mounting plate 18.

Still referring to FIG. 1, the multi-layer planar bus structure 14 also includes a number of holes or openings 46,52,60 passing therethrough from the outwardly facing upper surface 38, through the layers 32, 34 and 36 (and thermal plane 65 when present), through to the opposite outwardly facing lower surface 28. As will become apparent, the holes or openings 46,52,60 are in alignment and registration with corresponding positive and negative polarity DC voltage inputs and the AC output of the high frequency switching power semiconductor device packages 16,16. Nuts or other attachment or coupling means in the surface of the device packages 16,16 serve as external electrical connection means to the switching power semiconductor devices contained within each respective package.

The low inductance modular capacitor 12 has a substantially flat outwardly facing lower surface 40 which is in contact with the surface 38 of the multi-layer planar bus structure 14 when the interconnection assembly 10 is completed. The low inductance modular capacitor 12 further includes a number of holes or openings 44,50 passing therethrough and which holes or openings are in alignment and registration with like polarity holes 46,52 in the multi-layer planar bus structure 14 and the respective connection nuts or inputs 48,54 in the high frequency switching power semiconductor device package 16. In the illustrated embodiment, holes or openings identified as having a negative polarity in the low inductance modular capacitor 12 are designated 44,44 and which are in corresponding registration with negative polarity holes 46,46 in the multi-layer planar bus structure 14 and with the negative polarity connection nut or input 48 of the high frequency switching power semiconductor device package 16. Holes or openings identified as having a positive polarity in the low inductance modular capacitor 12 are designated 50,50 and which are in corresponding registration with positive polarity holes 52,52 in the multi-layer planar bus structure 14 and with the positive polarity connection nut or input 54 of the high frequency switching power semiconductor device package 16.

As shown in FIG. 1, a plurality of screws 56,56 are used to provide an electrical and physical connection by interconnecting the respective polarity electrodes of the low inductance modular capacitor to the corresponding polarity voltages carried by the multi-layer planar bus structure 14 and to the high frequency switching power semiconductor devices 16 and to fasten and hold the interconnection assembly 10 together. In the illustrated embodiment, the screw 56 has a threaded portion 64 which is screwed into the corresponding threaded nut 48, 54, 58 of the high frequency switching power semiconductor device package. Likewise, a plurality of screws 57,57 slightly shorter in length than the screws 56,56 are used to provide an electrical and physical connection between the respective polarity electrodes of the low inductance modular capacitor and the corresponding polarity voltages carried by the multi-layer planar bus structure 14 and to additionally fasten and hold the low inductance modular capacitor to the bus structure 14. In the illustrated embodiment, the screw 57 has a threaded portion 64 which is screwed into the corresponding threaded holes 47,53 in the bus structure 14 to attach to the proper polarity voltage carrying layer. The arrangement as shown in FIG. 1 provides a distributed filter capacitance in close proximity to the respective polarity voltages carried by the respective voltage carrying layer of the multi-layer planar bus structure 14 to provide low frequency filtering of the supply voltage. This relatively simple connection method not only accelerates and simplifies the construction of the low impedance interconnection assembly during manufacturing but also provides a number of electrical and mechanical benefits as will become apparent below. The supplementary connection provided to the modular capacitor achieves further reduction of equivalent series inductance of the entire modular capacitor as measured from the DC voltage bus structure; provides further reduction of equivalent series resistance of the capacitor and further reduces as a result of additional mechanical attachment of the modular capacitor to the bus structure 14 the susceptibility of the modular capacitor to shock and vibration.

A respective screw 56 passes through a corresponding opening 44,50 in the low inductance modular capacitor 12 and is in electrical and physical contact with a respective negative or positive electrode of the modular capacitor and is selectively connected to either a positive or negative polarity DC voltage carrying layer 32,34 in the multi-layer planar bus structure 14 to provide the proper polarity voltage connection between the respective polarity electrodes of the modular capacitor 12 and the positive DC voltage input 54 and negative DC voltage input 48 respectively of the high frequency switching power semiconductor device package 16. The multi-layer planar bus structure 14 is of a conventional design wherein alternating holes in registration between adjacent layers are of different diameters to allow the passage of the shank of the screw through one layer without contact but in contact with another desired layer. The design of the multi-layer planar bus structure also takes creepage into consideration to prevent short circuiting between voltage carrying layers.

A respective screw 56 is also used to provide an electrical and physical connection to the AC output 58 of the high frequency switching power semiconductor device package. In the illustrated embodiment, the output 58 of the high frequency switching power semiconductor device package is in registration with a non-connection pass-through hole or opening 60 in the multi-layer planar bus structure 14 and a non-connection passthrough hole or opening 62 in the low inductance modular capacitor 12 to provide an electrical and physical AC output connection from the high frequency semiconductor power switching device. In an actual embodiment, the screws are recessed within the low inductance modular capacitor package as described in further detail below.

The multi-layer planar bus structure 14 as described above may take on different embodiments to accommodate specific applications. For example, the multi-layer planar bus structure may be configured with additional layers to carry the AC phase voltage output from the high frequency switching power semiconductors. Although not shown in the figures, suitable terminals for electrical and mechanical connection to the respective AC and DC voltage potential layers are provided to make external wiring connections.

Figure 3:
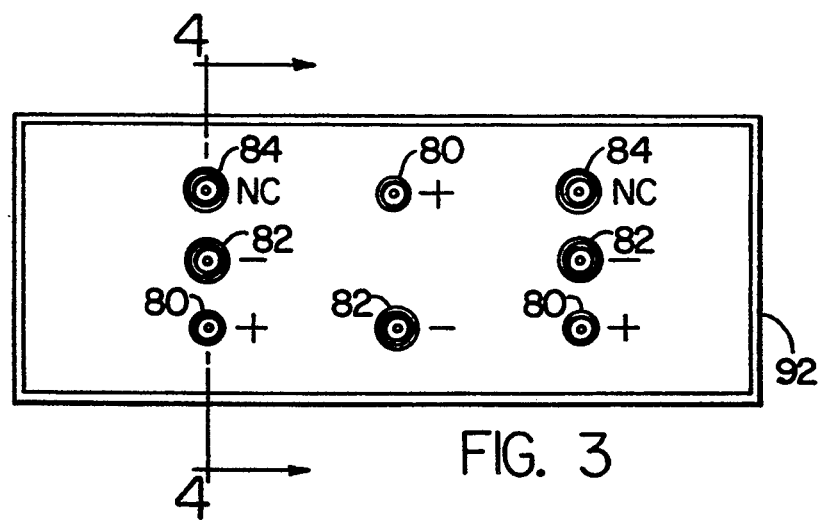
FIG. 3 is a top plan view of one embodiment of the low inductance modular capacitor of the present invention showing a given terminal arrangement to accommodate the terminal pattern of the switching power semiconductor devices shown in FIG. 1.
Figure 4:
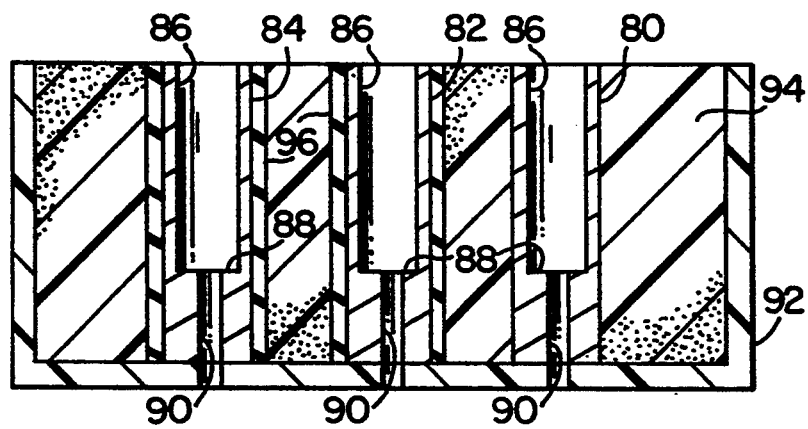
FIG. 4 is a cross section view taken along the line 4—4 of FIG. 3 showing the connection bushings through which the screws pass to mechanically and electrically connect the modular capacitor to the components of the low impedance interconnection assembly.

Turning now to FIGS. 3-8, the low inductance modular capacitor 12 of the present invention is described in further detail. FIG. 3 is a top plan view of the low inductance modular capacitor 12 showing an arrangement of connection bushings to receive the screws therethrough and to accommodate the terminal pattern of the high frequency switching semiconductor device packages shown in FIG. 1. Predetermined ones of the connection bushings, as will become apparent, also define connection points to the positive and negative polarity electrodes of the low inductance modular capacitor. In FIG. 3, connection bushings 80,80 define the positive polarity connection to the positive polarity electrode of the low inductance modular capacitor 12; connection bushings 82,82 define the negative polarity connection to the negative polarity electrode of the low inductance modular capacitor, and connection bushings 84,84 define pass-through attachment points. FIG. 4 illustrates a cross section view along the line 4—4 of FIG. 3 taken through the connection bushings 80,82 84, respectively. Each connection bushing has a recessed opening 86 leading to a radial axially facing abutment face 88 and coaxial opening 90 through which the shoulder screw passes to allow the screw head to come into contact with the abutment face to prevent the screw from completely passing through the connection bushing. When the screw is tightened, the modular capacitor is draw into contact with the surface of the bus structure. The enclosure housing 92 is preferably non-metallic and receives the capacitor elements, connection bushings and other elements of the low inductance modular capacitor as described in further detail below, all of which are encapsulated with an epoxy filler 94 or other suitable filler which may be used for encapsulation and which fillers are well known to those skilled in the art. A layer 96 of dielectric material is wrapped around the negative polarity connection bushing 82 and the pass-through connection bushing 84 to prevent electrical shorting or connection to the positive polarity electrode of the capacitor elements.

Figure 5:
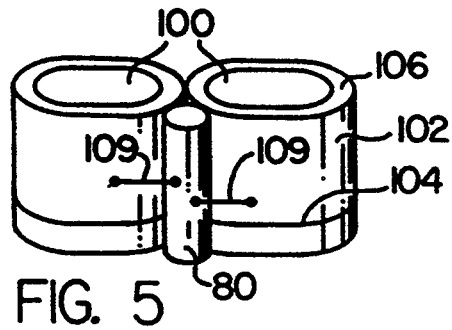
FIG. 5 is a side elevation view showing the connection of the conductive foil jackets two capacitor elements of the modular capacitor to a positive polarity connection bushing through which a screw passes to make contact therewith.

The low inductance modular capacitor 14 is formed by packaging a plurality of standard film/foil wound enclosureless capacitor elements 100,100 vertically into an enclosure housing 92. The film/foil wound capacitor elements 100,100 are inserted vertically into the enclosure housing 92 in either the standard cylindrical configuration or as illustrated in FIGS. 5-8 as a flatten oval configuration to achieve a higher density package. As illustrated in FIG. 5, each of the capacitor elements 100,100 is enclosed in a metallic, preferably a copper foil jacket 102 which covers substantially the outer peripheral surface area between the top and bottom of the capacitor element extending as close to the bottom of the capacitor element as is practical. The copper foil jacket 102 extends slightly beyond the top of the capacitor element and is bent or folded over to cover a portion of the top and provide a physical and electrical connection surface 106. The copper foil jacket 102 is electrically connected to a positive polarity connection bushing 80 which is electrically bonded to the copper foil jacket 102 by wires 109,109 connected between the connection bushing 80 and the surface of the copper foil jacket 102 as close as possible to the lower end 104 of the foil jacket.

Figure 6:
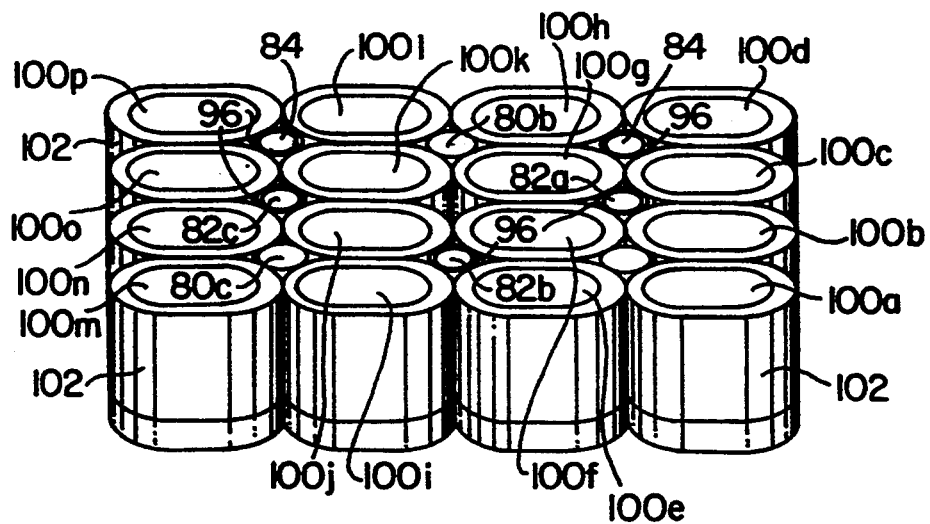
FIG. 6 is a schematic top perspective view of one arrangement of the capacitor elements of the modular capacitor shown with the enclosure housing and conductive foil "I"-shaped pattern strip removed.

FIG. 6 shows a somewhat schematic perspective view of an arrangement of the capacitor elements 100a–100p in a side-by-side and edge-to-edge physical arrangement. The copper foil jacket 102 of selected ones of adjacently located capacitor elements 100a–100p are bonded to predetermined ones of the positive polarity connection bushings 80a–80c. In the embodiment of FIG. 6, the respective copper foil jackets 102,102 of capacitor elements 100a, 100b, 100e, 100f are bonded to the positive polarity connection bushing 80a; the respective copper foil jackets of capacitor elements 100g, 100h, 100k 100l are bonded to the positive polarity connection bushing 80b; the respective copper foil jackets of capacitor elements 100i, 100j, 100m, 100n are bonded to the positive polarity connection bushing 80c. In this embodiment, the respective copper foil jackets of capacitor elements 100c, 100d, 100o, 100p are not bonded to a positive polarity connection bushing.

Figure 7:
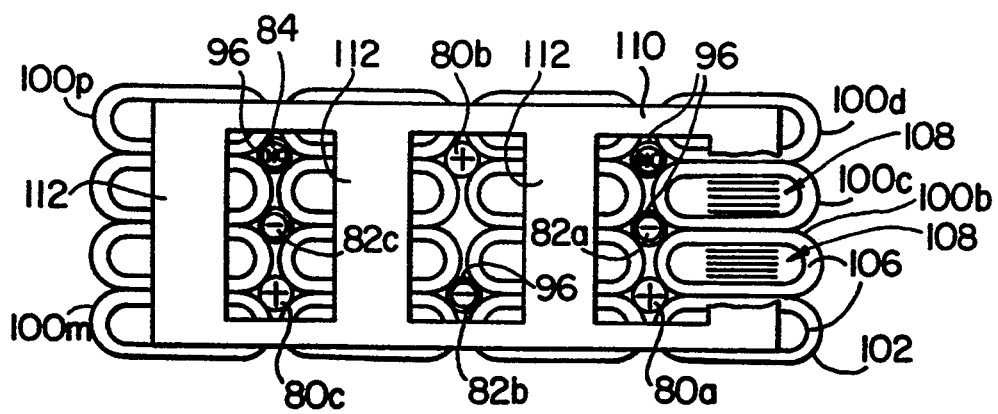
FIG. 7 is a top plan schematic view of the modular capacitor of FIG. 3 with the enclosure housing removed showing the conductive foil "I"-shaped pattern partially cut away to expose the terminals or tabs defining the positive polarity electrodes of two adjacent capacitor elements.
Figure 8:
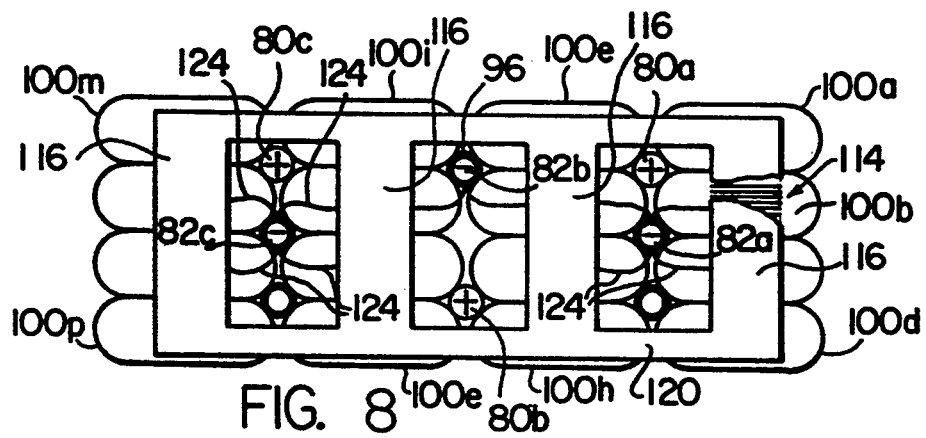
FIG. 8 is a bottom plan schematic view of the modular capacitor of FIG. 3 showing the capacitor elements with the enclosure housing removed and the electrical connection of the conductive foil "I"-shaped pattern to the negative polarity connection bushings.

Referring now to FIGS. 7 and 8, an "I"-shaped conductive foil pattern strip 110, preferably copper, is disposed along the tops of the capacitor elements 100a–100p and is shown partially cut away to reveal the exposed edges of the film/foil forming the terminals or tabs generally designated 108,108 and which define the positive electrode of the capacitor elements 100b,100c, respectively. The "I"-shaped conductive foil pattern strip 110 provides a large surface area along the web 112 of the "I" for carrying current and is electrically and physically connected to the bent over top surface 106 of the respective copper foil jackets 102,102 using well known bonding methods. In addition, the terminals or tabs 108,108 of the respective capacitor elements 100a–100p are electrically connected and attached to the surface of the "I"-shaped conductive foil pattern strip 110 facing the capacitor elements by means of zinc spray, for example, or other conventional bonding methods well known to those skilled in the art.

A second "I"-shaped conductive foil pattern strip 120, preferably copper, is disposed along the bottoms of the capacitor elements 100a–100p and is shown partially cut away to reveal the exposed edges of the film/foil forming the terminals or tabs generally designated 114 and which define the negative electrode of the capacitor element 100b. The terminals or tabs 114,114 of the respective capacitor elements 100a–100p are electrically connected and attached to the surface of the "I"-shaped conductive foil pattern strip 120 facing the capacitor elements by means of zinc spray, for example, or other conventional bonding methods well known to those skilled in the art. As in the case of the positive polarity connection bushings, the negative polarity connection bushings are interposed vertically between selected predetermined ones of adjacent capacitor elements 100a–100p. In the illustrated embodiment, the negative polarity connection bushing 82a is located adjacent capacitor elements 100b,100c,100f,100g; the negative polarity connection bushing 82b is located adjacent capacitor elements 100e,100f,100i,100j; the negative polarity connection bushing 82c is located adjacent capacitor elements 100j,100k,100n,100o. Each of the respective negative polarity connection bushings is electrically connected to the "I"-shaped conductive foil pattern strip 120 via conductive wires 124,124 which have one end electrically connected to the negative polarity connection bushing and its opposite end electrically bonded to the web 116 of conductive foil strip 120 in the region surrounding the connection bushing.

The "I"-shaped conductive foil pattern strips 110 and 120 respectively create a zone of low inductance in the region closest to the foil of the capacitor elements 100a–100p so that a significant portion of each capacitor element has a relatively low inductance region which is used to deliver high slew rate switching currents. The central region of the capacitor element 100a–100p has a higher inductance, but is still effective in filtering the low frequency currents developed in the switching of the semiconductor devices.

The direct connection of the shoulder screws from the positive and negative polarity electrodes of the low inductance modular capacitor to the respective positive and negative terminals of the high frequency switching power semiconductor devices permit the immediate supply of the high slew rate currents required by the semiconductor switching devices. Since all the capacitor elements 100a–100p are connected directly to the low inductance multi-layer planar bus structure 14 by means of the screws, the capacitor elements making up the modular capacitor have a low impedance path to every high frequency switching power semiconductor device. The result of the direct connection of all the capacitors collectively to every switching power semiconductor device means that the high slew rate current required by any one of the switching power semiconductor devices during the switching process is delivered by all the capacitor elements. Because the switching power semiconductor devices do not all switch at the same time, the current sharing among all the capacitor elements of all the low inductance modular capacitors assembled results in reduced loss in the capacitors and these losses are N times lower than in the case were the same number of N capacitors supply current to only their own respective switching power semiconductor devices.

A low impedance interconnection assembly for connecting high frequency switching power semiconductor devices to a DC voltage power source and low inductance modular capacitor has been described above in a preferred embodiment. Numerous changes and modifications may be made to the embodiments described without departing from the spirit and scope of the invention. For example, the modular capacitor is disclosed with standard film/foil wound enclosureless capacitor elements; however, it will be recognized that other capacitor constructions may also be employed. Therefore, the invention has been described by way of illustration rather than limitation.

The invention claimed:

1. A low impedance interconnection assembly for use with high frequency switching power semiconductor devices, said assembly comprising:
   a heat sink mounting plate having an outwardly facing substantially flat surface;
   a plurality of semiconductor switching devices each of said devices having:
      means forming a positive polarity DC voltage input connection;
      means forming a negative polarity DC voltage input connection;
      means forming an AC voltage output connection, and
      means for attachment to said heat sink mounting plate;
   means defining a low inductance multi-layer planar bus structure having an outwardly facing lower surface to provide a contact surface for each of said semiconductor switching devices, an outwardly facing upper surface, a first layer carrying a positive DC voltage potential, a second layer carrying a negative DC voltage potential and a dielectric layer separating said first and second layers;
   means defining a modular capacitor having at least one positive polarity electrode connection means and at least one negative polarity electrode connection means, said modular capacitor having a first outwardly facing surface for contact with said outwardly facing upper surface of said multi-layer bus structure;
   first means for electrically coupling said modular capacitor positive polarity electrode connection means to said first layer of said multi-layer bus structure and said semiconductor positive polarity DC voltage input means;
   second means for electrically coupling said modular capacitor negative polarity electrode connection means to said second layer of said multi-layer bus structure and said semiconductor negative polarity DC voltage input means;
   third means for electrically coupling said semiconductor switching device AC voltage output to an AC output connection means;
   said first and second electrically coupling means further defining attachment means for holding said modular capacitor, multi-layer bus structure and said semiconductor switching devices in a first laminated unitary structure.

2. A low impedance interconnection assembly as defined in claim 1 wherein said low inductance multi-layer planar bus structure further comprises at least one thermal plane of thermally conductive material adjacent and parallel to at least one of said first and second layers for conducting heat out of said adjacent first and second layer.

3. A low impedance interconnection assembly as defined in claim 2 further comprising thermally conductive bushing means coupled to said low inductance multi-planar bus structure for conducting heat out of said bus structure.

4. A low impedance interconnection assembly as defined in claim 3 further comprising said thermally conductive bushing means coupled to said at least one thermal plane.

5. A low impedance interconnection assembly as defined in claim 1 wherein said first and second electrically coupling means defining said attachment means further comprise at least one means having a threaded end and an operative turning enlarged end opposite said threaded end, said modular capacitor and said multi-layer bus structure further including respective corresponding positive and negative polarity connection means in registration with one another and with a respective corresponding positive and negative polarity DC voltage input connection means of a respective one of said semiconductor switching devices, said attachment means passing through said modular capacitor and said multi-layer bus structure and making electrical and mechanical connection with a respective corresponding positive and negative polarity connection means in said modular capacitor and said multi-layer bus and with a corresponding positive and negative polarity connection means in a respective one of said semiconductor switching devices, said enlarged end engaging with an a abutment face to prevent said attachment means from passing completely through said modular capacitor.

6. A low impedance interconnection assembly as defined in claim 5 wherein said modular capacitor provides distributed capacitance between the positive and negative DC voltage potentials carried by said multi-layer bus structure.

7. A low impedance interconnection assembly as defined in claim 5 further comprising:
   said multi-layer bus structure having a longitudinal length so as to define a marginal shoulder region disposed oppositely on said upper and lower facing surfaces along a respective end region of said bus structure when said modular capacitor and said semiconductor switching power devices are held in said first laminated unitary structure;
   thermal spacer means located adjacent to and disposed between said multi-layer bus structure lower facing surface along said marginal shoulder region and said heat sink mounting plate for providing a mechanical support and maintaining said bus structure and said heat sink mounting plate in a spaced relation, said thermal spacer means being fastened between said bus structure and said heat sink mounting plate to prevent vibration of said bus structure and to conduct heat from said planar bus structure to said heat sink mounting plate.

8. A low impedance interconnection assembly as defined in claim 1 wherein said modular capacitor further comprises:
   a plurality of film/foil wound enclosureless capacitor elements, each of said capacitor elements having a first end and a second end opposite said first end, said first end defining a top surface and said second end defining a bottom surface, each of said film/foil wound enclosureless capacitor elements having film/foil tabs extending beyond the respective top and bottom surfaces and defining positive polarity and negative polarity electrodes, respectively;
   conductive foil jacket means covering substantially the outer peripheral surface area between said top surface and bottom surface of each of said capacitor elements and extending slightly beyond the top surface and being bent over to partially cover said top surface of said capacitor element surrounding said film/foil tabs defining said capacitor element electrodes;
   first conductive means for electrically connecting said conductive foil jacket means of predetermined ones of adjacent capacitor elements to respective predetermined ones of said positive polarity electrode connection means, said jacket means being connected at locations on the peripheral surface of said jacket means in close proximity to said bottom of said capacitor element;
   first conductive foil "I"-shaped pattern means having web portions disposed atop said capacitor elements adjacent to and electrically connected with said conductive foil jacket means at the bent over top surfaces and with said film/foil tabs defining said positive electrodes of said capacitor elements whereby said first conductive foil "I"-shaped pattern means is electrically connected to said positive polarity electrode connection means;
   second conductive foil "I"-shaped pattern means having web portions disposed against the bottom surface of said capacitor elements and electrically connected with said film/foil tabs defining said negative electrodes of said capacitor elements;
   second conductive means for electrically connecting said second conductive foil "I"-shaped pattern means to respective ones of said negative polarity electrode connection means located in the region of said second conductive foil "I"-shaped pattern means;
   means for encapsulating said interconnected capacitor elements in an enclosure housing whereby said positive and negative polarity connection means extend through said enclosure housing.

9. A low impedance interconnection assembly as defined in claim 8 wherein said first and second conductive foil "I"-shaped pattern means is made of copper.

10. A low impedance interconnection assembly for use with high frequency switching power semiconductor devices, said assembly comprising:
   a heat sink mounting plate having an outwardly facing substantially flat surface;
   a plurality of semiconductor switching devices each of said devices having along an outwardly facing upper surface a means forming a positive polarity DC voltage input, means forming a negative polarity DC voltage input and means forming an AC voltage output, and an outwardly facing lower surface having means for attachment to said heat sink mounting plate;
   means forming a multi-layer planar bus structure having an outwardly facing lower surface in contact with said outwardly facing upper surface of each of said semiconductor switching devices, an outwardly facing upper surface, a first layer carrying a positive DC voltage potential, a second layer carrying a negative DC voltage potential, a dielectric layer separating said first and second layers and a thermal layer of conductive material dielectrically isolated from said first and second layers;
   at least one modular capacitor having at least one positive electrode connection means and at least one negative electrode connection means, said modular capacitor having an outwardly facing lower surface in contact with said outwardly facing upper surface of said multi-layer bus structure;
   first means for electrically coupling said modular capacitor positive electrode means to said first layer of said multi-layer bus structure and said semiconductor positive polarity DC voltage input means;

second means for electrically coupling said modular capacitor negative electrode means to said second layer of said multi-layer bus structure and said semiconductor negative polarity DC voltage input means;

said first and second electrically coupling means further forming attachment means for holding said modular capacitor, multi-layer bus structure and said semiconductor switching devices in a laminated assembly;

third thermally conductive means for mechanically connecting the thermal layer of said multi-layer bus structure to said heat sink mounting plate.

11. A low inductance modular capacitor for use with a low impedance interconnection assembly, said modular capacitor comprising:

at least one positive polarity electrode connection means;

at least one negative polarity electrode connection means;

a plurality of film/foil wound enclosureless capacitor elements, each of said capacitor elements having a first end and a second end opposite said first end, said first end defining a top surface and said second end defining a bottom surface, each of said film/foil wound enclosureless capacitor elements having film/foil tabs extending beyond the respective top and bottom surfaces and defining positive polarity and negative polarity electrodes, respectively;

conductive foil jacket means covering substantially the outer peripheral surface area between said top surface and bottom surface of each of said capacitor elements and extending slightly beyond the top surface and being bent over to partially cover said top surface of said capacitor elements surrounding said film/foil tabs defining said capacitor element electrodes;

first conductive means for electrically connecting said conductive foil jacket means of adjacent capacitor elements to respective predetermined ones of said positive polarity electrode connection means, said jacket means being connected at locations on the peripheral surface of said jacket means in close proximity to said bottom of said capacitor elements;

first conductive foil "I"-shaped pattern means having web portions disposed atop said capacitor elements adjacent to and electrically connected with said conductive foil jacket means at the bent over top surfaces and with said film/foil tabs defining said positive electrodes of said capacitor elements whereby said first conductive foil "I"-shaped pattern means is electrically connected to said at least one positive polarity electrode connection means;

second conductive foil "I"-shaped pattern means having web portions disposed against the bottom of said capacitor elements and electrically connected with said film/foil tabs defining said negative electrodes of said capacitor elements;

second conductive means for electrically connecting said second conductive foil "I"-shaped pattern means to respective ones of said at least one negative polarity electrode connection means located in the region of said second conductive foil "I"-shaped pattern means;

means for encapsulating said interconnected capacitor elements in an enclosure housing whereby said positive and negative polarity connection means extend through said enclosure housing.

* * * * *